United States Patent [19]

Kosakowski

[11] 4,001,813
[45] Jan. 4, 1977

[54] PRECISION CAPACITANCE TO DIGITAL CONVERSION SYSTEM
[75] Inventor: Henry R. Kosakowski, Denville, N.J.
[73] Assignee: The Bendix Corporation, Teterboro, N.J.
[22] Filed: July 2, 1975
[21] Appl. No.: 592,585
[52] U.S. Cl. .......................... 340/347 R; 324/60 C
[51] Int. Cl.² ....................................... H03K 13/02
[58] Field of Search ............ 324/60 R, 60 C, 61 R, 324/99 D; 340/347 AD

[56] References Cited
UNITED STATES PATENTS

| | | | |
|---|---|---|---|
| 3,562,641 | 2/1971 | Fulks | 324/99 D |
| 3,663,955 | 5/1972 | Shimizu | 324/60 R |
| 3,801,902 | 4/1974 | Horowitz | 324/61 R |

Primary Examiner—Charles D. Miller
Attorney, Agent, or Firm—Anthony F. Cuoco; S. H. Hartz

[57] ABSTRACT

A capacitance to digital conversion system wherein condition sensing capacitors are arranged with reference capacitors in a circuit configuration so as to eliminate the need for an absolute a.c. voltage thereby imparting a high degree of precision to the system. Primary error sources are virtually eliminated since all operations are performed on an error signal and a single oscillator drives both sensing and reference capacitors so that frequency variations in the output of the oscillator have no effect on the accuracy of the measurement being made. Additionally, the high degree of precision is accomplished with a significant reduction in hardware.

6 Claims, 2 Drawing Figures

PRECISION CAPACITANCE TO DIGITAL CONVERSION SYSTEM

BACKGROUND OF THE INVENTION

1. Field of the Invention

This invention relates generally to analog to digital converters and particularly to converters for converting the output of a condition sensing capacitor arrangement to a digital word. More particularly, this invention relates to a converter of the type described which has increased precision and reduced hardware as compared to devices now known in the art.

2. Description of the Prior Art

Air data computers used for aircraft navigational purposes employ capacitor arrangements whereby capacitance changes as a function of atmospheric pressure and is thus a measure of the altitude of the craft. The capacitors provide analog signals which, for most modern day applicatins, must be converted to digital words. Conversion apparatus presently employed involves precision bridge circuits which provide an a.c. voltage related to the capacitance change being measured. The a.c. voltage is then converted to a digital word through the use of precision conversion apparatus such as described in commonly assigned U.S. Pat. No. 3,882,488, issued on May 6, 1975 to Henry R. Kosakowski and Douglas J. Washburn. The conversion system described in the aforenoted U.S. Pat. No. may be used to provide measurements of static and dynamic pressure which are utilized by the air data computer for the aforenoted aircraft navigational purposes.

The bridge circuits involved in the prior art apparatus require a large number of precision passive and active components to obtain absolute voltages related to static and dynamic pressure as is required. Further, a considerable amount of filtering is necessary to reduce the errors associated with the harmonic distortion and power supply variations. This, in turn, imparts frequency sensitivity to the output of oscillators used in the system, thus requiring very stable oscillators. It will be recognized by those skilled in the art that the aforenoted factors represent serious disadvantages in a conversion system for the purposes described.

SUMMARY OF THE INVENTION

This invention contemplates a capacitance to digital conversion system including a non-precision, low source impedance oscillator for providing a reference a.c. voltage ($E_R$) for driving reference capacitors and an N bit digital to analog converter. The digital to analog converter provides a signal ($E_S$) which is 180° out of phase with signal ($E_R$) at a magnitude of $(X/2^N) \cdot E_R$ (X = the input to the digital to analog converter), and which signal is at a level so that the current through the sensing capacitors equals the negative of the current through the reference capacitors. Thus, if the currents through the reference and sensing capacitors are not equal and opposite, an error voltage is developed which is used to provide a d.c. error signal related to static pressure ($P_S$) or dynamic pressure ($P_T$), as the case may be. The d.c. error signal is converted to a digital signal and integrated, the count of which is an indirect measurement of the capacitance of the sensing capacitor, and since the capacitance is directly related to the pressure being measured, the digital count is indirectly related to said pressure. With the exception of the errors in the digital to analog converter, which are normally an order of magnitude less than the required accuracy of the system, no other primary error sources exist, since all operations are performed on an error signal. Further, since both the sensing and reference capacitors are driven directly by a single oscillator, frequency variations of the oscillator have no effect on the accuracy of the measurement being made.

The main object of this invention is to provide a precision converter for converting the analog output of a condition sensing capacitor arrangement to a digital word.

Another object of this invention is to perform the conversion with reduced hardware as compared to devices now known in the art.

Another object of this invention is to limit the error sources involved by performing all operations on an error signal and thereby enhancing the precision characteristics of the device.

Another object of this invention is to provide a device of the type described which is relatively insensitive to frequency variations of an a.c. driving voltage.

Another object of this invention is to relate the sensing and reference capacitors to the same a.c. driving voltage without interim filtering, thereby negating the effect of voltage variations and harmonic distortion in the driving voltage.

Still another object of this invention is to adapt the device described to sensing pressure variations, and to utilize a computer controlled switching arrangement for measuring variations in static and dynamic pressure such as may be utilized in an air data computer or the like.

The foregoing and other objects and advantages of the invention will appear more fully hereinafter from a consideration of the detailed description which follows, taken together with the accompanying drawings wherein one embodiment of the invention is illustrated by way of example. It is to be expressly understood, however, that the drawings are for illustration purposes only and are not to be construed as defining the limits of the invention.

DESCRIPTION OF THE INVENTION

Figure 1:
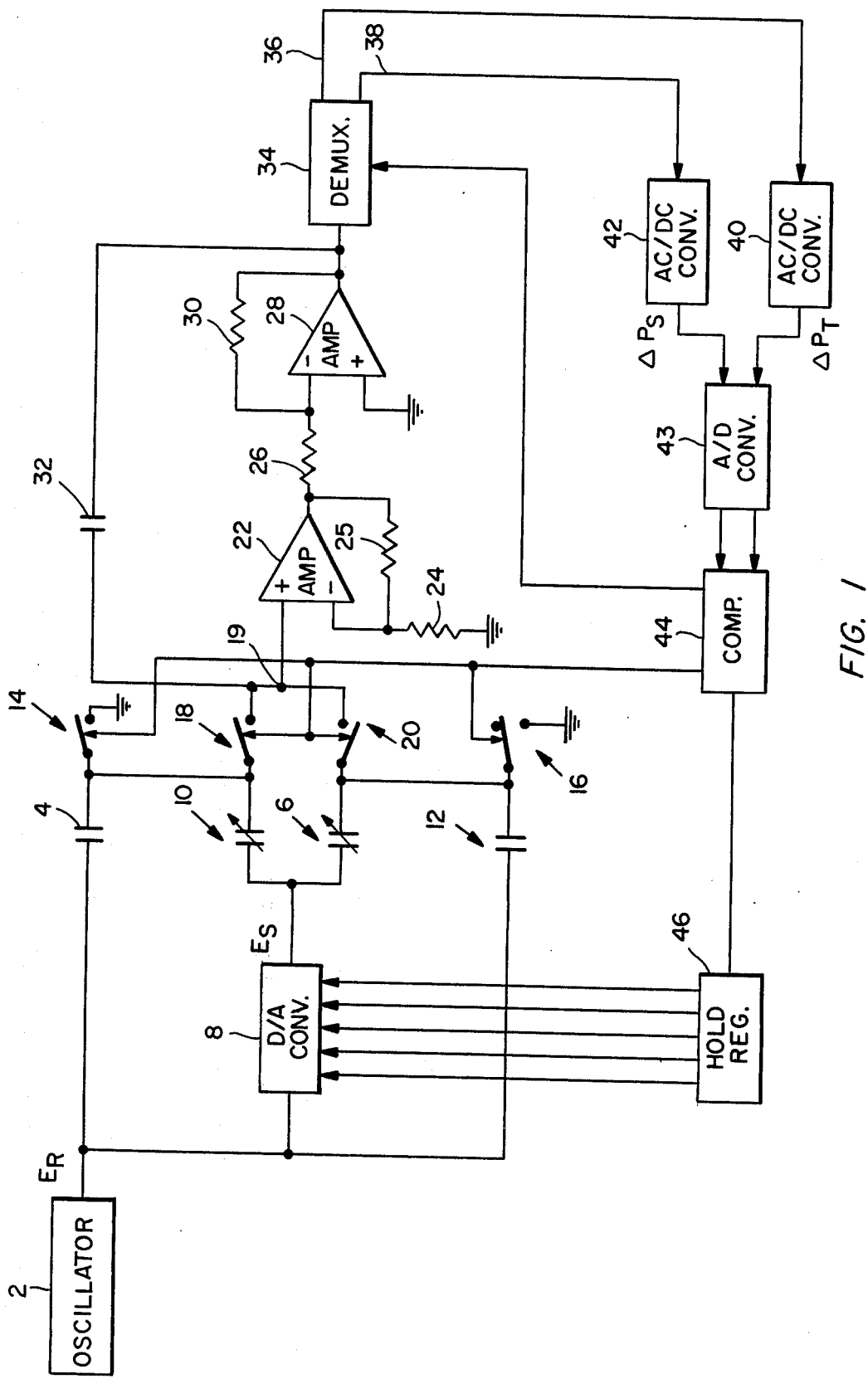
FIG. 1 is a combination block diagram-electrical schematic showing the structural relationship of the components of the invention.

With reference first to FIG. 1 an oscillator designated by the numeral 2, and which oscillator 2 may be of a conventional type non-precision, low source impedance oscillator, provides an alternating signal $E_R$ at a frequency of, for example, 3 KHZ. Signal $E_R$ is applied to a reference capacitor 4 and to a reference capacitor 12. Signal $E_R$ is applied to a multi-bit digital to analog converter 8, which may be for purposes of illustration an 18 bit converter and which provides a signal $E_S$. Digital to analog converter 8 is arranged so that signal $E_S$ is always 180° out of phase with signal $E_R$ at a magnitude of $X/2^{18} \cdot E_R$ (X = the digital to analog converter input).

Signal $E_S$ is applied to a sensing capacitor 6 and to a sensing capacitor 10. Signal $E_S$ seeks a voltage level such that the current through sensing capacitor 10 equals the negative of the current through reference capacitor 4, or the current through sensing capacitor 6 equals the negative of the current through reference capacitor 12, as will hereinafter become more evident.

Reference capacitor 4 is connected to a normally open switch 14 which is connected to ground when closed, and reference capacitor 12 is connected to a normally open switch 16 which is connected to ground when closed. Sensing capacitor 10 is connected to a normally open switch 18 and sensing capacitor 6 is connected to a normally open switch 20. Switches 18 and 20, when closed, are connected to a circuit summing point 19 which, in turn, is connected to the non-inverting input terminal (+) of an amplifier 22, and which amplifier 22 has an inverting input terminal (−) connected to ground through a resistor 24 and has a feedback resistor 25 connected to its output terminal and to the inverting input terminal (−).

The output terminal of amplifier 22 is connected through a resistor 26 to the inverting input terminal (−) of an amplifier 28. Amplifier 28 has an non-inverting input terminal (+) connected to ground and a feedback resistor 30 connected to its output terminal and to its inverting input terminal (−). Switches 18 and 20 are connected to a feedback capacitor 32 when closed as will be hereinafter explained, and which feedback capacitor 32 is connected to the output terminal of amplifier 28 and to circuit summing point 19 at which an error signal is provided.

As heretofore noted, the device of the invention may utilize the sensed change in capacitance provided by sensing capacitors 6 and 10 for providing measurements of static and dynamic pressure, and for this purpose the capacitors are multiplexed as shown and described. To achieve the desired conversion from capacitance to static or dynamic pressure, a conventional type demultiplexer 34 is connected to the output terminal of amplifier 28 and provides an output at an output line 36 and another output at an output line 38. The output at output line 36 is applied to a conventional type a.c. to d.c. converter 40 and the output at output line 38 is applied to a like a.c. to d.c. converter 42. A.c. to d.c. converters 40 and 42 serve the further purpose of performing a quadrature rejection function. A.c. to d.c. converter 40 thus provides an error signal $\Delta P_T$ corresponding to dynamic pressure, and a.c. to d.c. converter 42 provides an error signal $\Delta P_S$ corresponding to static pressure.

Error signals $\Delta P_S$ and $\Delta P_T$ are applied through an analog to digital converter 43 to a computer 44 which includes arithmetic units and an integrating unit for operating on the error signals as described in the aforenoted U.S. Pat. No. 3,882,488. The computer output is fed back through a hold register 46 to digital to analog converter 8. Switches 14, 16, 18 and 20 are actuated by computer 44 as is demultiplexer 34, so that a digital count is provided related to dynamic or static pressure as the case may be. Thus, a digital count related to dynamic pressure is obtained by opening switches 16 and 18 and closing switches 14 and 20, while a digital count related to static pressure is provided by closing switches 16 and 18 and opening switches 14 and 20 as will be hereafter further described with reference to the flow diagram of FIG. 2.

OPERATION OF THE INVENTION

As heretofore noted, digital to analog converter 8 is arranged so that output $E_S$ therefrom is 180° out of phase with reference signal $E_R$ from oscillator 2 at a magnitude of $(X/2^{18} \cdot E_R$. The object of the signal $E_S$ from digital to analog converter 8 is to seek a voltage level such that the current through capacitor 10 equals the negative of the current through capacitor 4, or the current through capacitor 6 equals the negative of the current through capacitor 12, as the case may be.

Figure 2:
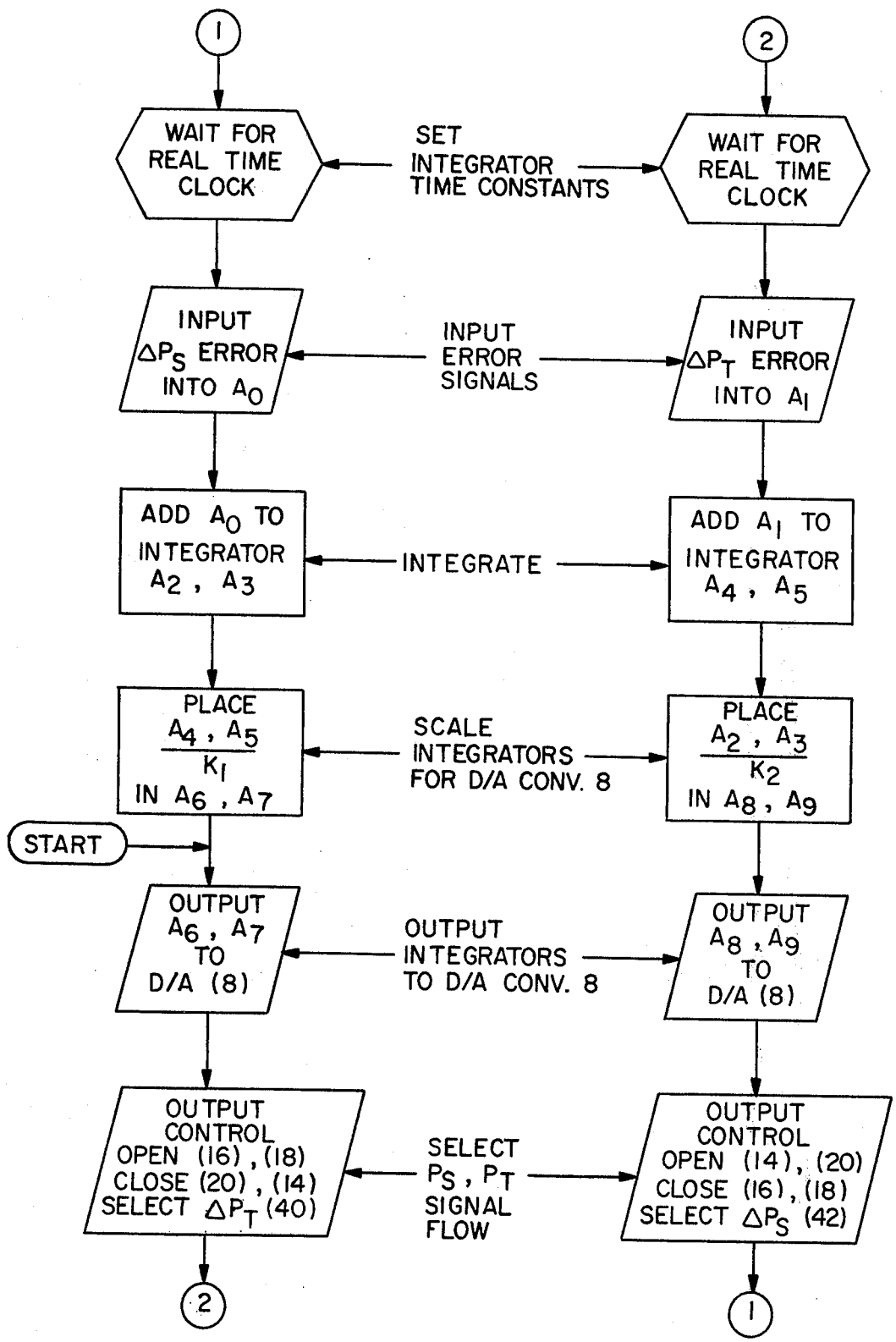
FIG. 2 is a flow chart showing the computer controlled function of the invention.

For example, if switches 16 and 18 are closed and switches 14 and 20 remain open through the action of computer 44 as illustrated in the flow chart of FIG. 2, and the currents through capacitors 4 and 10 are not equal and opposite, an error voltage is developed at circuit summing point 19. This error voltage is applied through amplifiers 22 and 28 and fed back to summing junction 19 through capacitor 32. Consequently, an a.c. error signal exists at the output of amplifier 28 equal to:

$$-\left( E_R \frac{C_4}{C_{32}} - E_S \frac{C_{10}}{C_{32}} \right). \qquad (1)$$

The error voltage is then applied through demultiplexer 34 to, for example, converter 42 to provide d.c. error signal $\Delta P_S$ corresponding to the static pressure error.

Error signal $\Delta P_S$ is applied through computer 44 as described in the aforenoted U.S. Pat. No. 3,882,488 and fed back to digital to analog converter 8 through hold register 46. Feedback through computer 44 forces signal $E_S$ to a value such that:

$$-\left( E_R \frac{C_4}{C_{32}} - E_S \frac{C_{10}}{C_{32}} \right) = 0; \qquad (2)$$

Under this condition the following relationship holds:

$$E_S = E_R \frac{C_4}{C_{10}}. \qquad (3)$$

Since signal $E_S$ equals the digital count from computer 44 multiplied by signal $$\left( \frac{E_R}{2^{18}} \right),$$

the digital count equals $$\left( \frac{C_4 \cdot 2^{18}}{C_{10}} \right).$$

, and since $C_4$ and $2^{18}$ are constant, the digital count is an indirect measurement of the capacitance of capacitor 10. Further, the capacitance of capacitor 10 is directly related to static pressure and therefore the digital count is indirectly related to static pressure.

It will now be understood that a digital count indirectly related to dynamic pressure i.e. $P_T$, is obtained in a similar manner by opening switches 16 and 18 and closing switches 14 and 20 through computer 44 as illustrated in the flow chart of FIG. 2. If digital counts directly related to static and dynamic pressure are desired they can be obtained by eliminating the inversion in digital to analog converter 8 and offsetting the digital to analog converter by $-E_R$, and whereby $E_S$ would then be represented by the following relationship:

$$E_S = -E_R\left(1 - \frac{X}{2^{IN}}\right) \quad (4)$$

Slope and zero adjustments can be made by adjusting the scaling of digital to analog converter 2 and the percentage of $-E_R$ offset as will be understood by those skilled in the art.

FIG. 2 is a flow chart illustrating a program for computer 44 in operating digital to analog converter 8, demultiplexer 34 and switches 14, 16, 18 and 20. In this connection it will be recognized that the designations $A_0$ to $A_9$ in the flow chart of FIG. 2 are indicative of accumulators included in the computer as is well known in the computer art.

The programmed sequence is started in accordance with the structural relationship of FIG. 1 when outputs are provided to digital to analog converter 8, whereupon output control for switches 16 and 18 which are opened and switches 20 and 14 which are closed, and control for selecting error signal $\Delta P_T$ through a.c./d.c. converter 40 via demultiplexer 34 is provided.

The sequence continues with an appropriate real time constant built into the program, whereupon error signal $\Delta P_T$ is integrated and scaled, and outputed to digital to analog converter 8. The computer output control function thereupon opens switches 14 and 20 while closing switches 16 and 18 for selecting through multiplexer 34 error signal $\Delta P_S$ via a.c./d.c. converter 42.

In continuation, an appropriate real time constant is built into the program and signal $\Delta P_S$ is integrated and scaled for application to digital to analog converter 8 whereupon the program sequence is repeated.

It will now be seen from the aforegoing description of the invention that with the exception of any errors that may be inherent in digital to analog converter 8, which are normally an order of magnitude less than the required accuracies of the system described, no other primary error sources exist since all operations are performed on an error signal. Moreover, since both the sensing and reference capacitors are driven directly by a single oscillator i.e. oscillator 2, frequency variations of the oscillator have no effect on the accuracy of the conversion being made. Further, for the same reason, interim filtering is not necessary and voltage variations and harmonic distortions cancel. Of further significance is the fact that a significant component reduction may be realized by constructing the invention as described as compared to prior art devices now available.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. A capacitance to digital conversion system comprising:
    a signal source for providing an alternating reference signal;
    reference capacitor means connected to the signal source and driven by the reference signal therefrom;
    a digital to analog converter connected to the reference signal source and driven by the reference signal therefrom for converting a digital signal to an analog alternating signal;
    condition sensing capacitor means connected to the digital to analog converter and driven by the analog alternating signal therefrom;
    means connected to the reference capacitor means and to the sensing capacitor means for providing an analog error signal related to the sensed condition when the currents through the reference and sensing capacitor means are other than equal and opposite said means including summing means connected to the reference and sensing capacitor means and responsive to the currents therethrough for providing an error signal;
    means for amplifying the error signal; and
    means connected to the amplifying means and to the summing means for feeding back the amplified signal to the summing means;
    means for converting the analog error signal to the digital signal; and
    means for feeding the digital signal to the digital to analog converter for conversion thereby to the analog alternating signal.

2. A capacitance to digital conversion system as described by claim 1, wherein:
    the means connected to the amplifying means and to the summing means for feeding back the amplified signal to the summing means includes a capacitor.

3. A capacitance to digital conversion system as described by claim 2, wherein the means for amplifying the error signal includes:
    a non-inverting amplifier connected to the summing means;
    an inverting amplifier connected to the non-inverting amplifier; and
    the amplified signal from the inverting amplifier being fed back to the summing means through the capacitor.

4. A capacitance to digital conversion system as described by claim 3, wherein:
    the amplified signal from the inverting amplifier being fed back to the summing means through the capacitor equals:

$$-\left(E_R \cdot \frac{C_R}{C_f} - E_S \cdot \frac{C_S}{C_f}\right);$$

where $E_R$ is the alternating reference signal, $E_S$ is the analog alternating signal, $C_R$ is the capacitance of the reference capacitance means, $C_S$ is the capacitance of the sensing capacitor means and $C_f$ is the capacitance of the feedback capacitor.

5. A capacitance to digital conversion system as described by claim 4, wherein:
    the means for feeding back the digital signal to the digital to analog converter for conversion thereby to the analog signal forces the analog signal to a value such that:

$$-\left(E_R \cdot \frac{C_R}{C_f} - E_S \cdot \frac{C_S}{C_f}\right) = 0; \text{ and}$$

$$E_S = E_R \cdot \frac{C_R}{C_S}.$$

6. A capacitance to digital conversion system as described by claim 1, wherein:

the analog alternating signal from the digital to analog converter seeks a level such that the current through the sensing capacitor means is equal and opposite to the current through the reference capacitor means.

* * * * *